United States Patent
Yoshida et al.

(10) Patent No.: US 9,905,750 B2
(45) Date of Patent: Feb. 27, 2018

(54) POLYMERIC PIEZOELECTRIC MATERIAL, AND PROCESS FOR PRODUCING THE SAME

(71) Applicant: Mitsui Chemicals, Inc., Minato-ku, Tokyo (JP)

(72) Inventors: Mitsunobu Yoshida, Ichihara (JP); Shigeo Nishikawa, Chiba (JP); Masaki Shimizu, Sodegaura (JP); Hiroshi Fukuda, Nagoya (JP)

(73) Assignee: MITSUI CHEMICALS, INC., Minato-Ku, Tokyo (JP)

( * ) Notice: Subject to any disclaimer, the term of this patent is extended or adjusted under 35 U.S.C. 154(b) by 0 days.

(21) Appl. No.: 15/263,862

(22) Filed: Sep. 13, 2016

(65) Prior Publication Data

US 2016/0380180 A1    Dec. 29, 2016

Related U.S. Application Data

(62) Division of application No. 13/981,488, filed as application No. PCT/JP2012/082237 on Dec. 12, 2012, now abandoned.

(30) Foreign Application Priority Data

Dec. 13, 2011 (JP) ................. 2011-272708

(51) Int. Cl.

| | |
|---|---|
| *H01L 41/193* | (2006.01) |
| *H01L 41/45* | (2013.01) |
| *B29C 35/02* | (2006.01) |
| *B29C 55/00* | (2006.01) |
| *B29C 55/16* | (2006.01) |
| *B29C 71/02* | (2006.01) |
| *C08G 63/08* | (2006.01) |
| *B29K 67/00* | (2006.01) |

(52) U.S. Cl.
CPC .............. *H01L 41/45* (2013.01); *B29C 35/02* (2013.01); *B29C 55/005* (2013.01); *B29C 55/16* (2013.01); *B29C 71/02* (2013.01); *C08G 63/08* (2013.01); *H01L 41/193* (2013.01); *B29C 2071/022* (2013.01); *B29K 2067/046* (2013.01); *B29K 2995/0003* (2013.01); *B29K 2995/004* (2013.01); *B29K 2995/0039* (2013.01)

(58) Field of Classification Search
CPC ................. B29K 2067/046; H01L 41/193
See application file for complete search history.

(56) References Cited

U.S. PATENT DOCUMENTS

| | | | |
|---|---|---|---|
| 5,298,602 A | 3/1994 | Shikinami et al. | |
| 2007/0037962 A1 | 2/2007 | Ueda et al. | |
| 2012/0025674 A1 | 2/2012 | Yoshida et al. | |
| 2012/0132846 A1 | 5/2012 | Yoshida et al. | |

FOREIGN PATENT DOCUMENTS

| | | |
|---|---|---|
| CN | 102484199 A | 5/2012 |
| EP | 2 469 618 A1 | 6/2012 |
| JP | 5-152638 A | 6/1993 |
| JP | 6-142184 A | 5/1994 |
| JP | 2005-213376 A | 8/2005 |
| JP | 2007-204727 A | 8/2007 |
| JP | 2011-117992 A | 6/2011 |
| JP | 2011-243606 A | 12/2011 |
| KR | 10-0948871 B1 | 3/2010 |
| WO | WO 2010/104196 A1 | 9/2010 |
| WO | WO 2012/026494 A1 | 3/2012 |

OTHER PUBLICATIONS

International Search Report (PCT/ISA/210) dated Jan. 15, 2013, by the Japanese Patent Office as the International Searching Authority for International Application No. PCT/JP2012/082237.
Written Opinion (PCT/ISA/237) dated Jan. 15, 2013, by the Japanese Patent Office as the International Searching Authority for International Application No. PCT/JP2012/082237.
Communication in cases for which no other form is applicable (Form PCT/IB/345) dated Sep. 3, 2013, in the corresponding International Application No. PCT/JP2012/082237. (2 pages).
Tsai, et al.: "Crystallinity and dimensional stability of biaxial oriented poly(lactid acid) films," Polymer Degradation and Stability, (Aug. 1, 2010), vol. 95, No. 8, Elsevier Ltd., Taiwan, Republic of China, pp. 1292-1298.
Extended European Search Report dated Oct. 22, 2014, by the European Patent Office in corresponding European Application No. 12857014.0 (13 pages).
Office Action issued in corresponding Chinese Application No. 201280019129.6 dated Jan. 4, 2015 (11 pages).
Lovell et al (Decoupling the Effects of Crystallinity and Orientation on the Shear Piezoelectricity of Polylactic Acid, Journal of Polymer Science Part B: Polymer Physics 2011, 49, 1555-1562).
Turner et al (Characterization of Drawn and Undrawn Poly-L-Lactide Films by Differential Scanning Calorimetry, Journal of Thermal Analysis and Calorimetry, vol. 75 (2004) 257-268).

*Primary Examiner* — Rachel Kahn
(74) *Attorney, Agent, or Firm* — Buchanan, Ingersoll & Rooney PC

(57) ABSTRACT

Provided is a process for producing a polymeric piezoelectric material including a first step of heating a sheet in an amorphous state containing the helical chiral polymer to obtain a pre-crystallized sheet, and a second step of stretching the pre-crystallized sheet in biaxial directions, wherein the polymeric piezoelectric material includes a helical chiral polymer having a weight-average molecular weight of from 50,000 to 1,000,000 and having optical activity, wherein a crystallinity of the material measured by a DSC method is from 20% to 80%, and a product of a standardized molecular orientation MORc measured by a microwave transmission type molecular orientation meter based on a reference thickness of 50 μm and the crystallinity is from 25 to 250.

13 Claims, No Drawings

POLYMERIC PIEZOELECTRIC MATERIAL, AND PROCESS FOR PRODUCING THE SAME

CROSS-REFERENCE TO RELATED APPLICATIONS

This application is a divisional of U.S. application Ser. No. 13/981,488, filed Jul. 24, 2013, which is a U.S. National Stage Application of PCT/JP2012/082237, filed Dec. 12, 2012, which claims priority to Japanese Patent Application No. 2011-272708, filed Dec. 13, 2011, the contents of all of which are hereby incorporated by reference.

TECHNICAL FIELD

The present invention relates to a polymeric piezoelectric material and a process for producing the same.

BACKGROUND ART

As a piezoelectric material a ceramic material of PZT ($PBZrO_3$—$PbTiO_3$ type solid solution) has been heretofore broadly used. However, since PZT contains lead, a polymeric piezoelectric material, which imposes less environmental burden and has higher flexibility, has been currently coming into use as a piezoelectric material.

Currently known polymeric piezoelectric materials can be classified roughly into 2 types. Namely, into 2 types of poled polymers, as represented by nylon 11, polyvinyl fluoride, polyvinyl chloride, polyurea, etc. and ferroelectric polymers, as represented by (β-type) polyvinylidene fluoride (PVDF), a vinylidene fluoride-trifluoroethylene copolymer (P(VDF-TrFE)) (75/25), etc.

However, polymeric piezoelectric materials are inferior to PZT in terms of piezoelectricity, and therefore improvement of the piezoelectricity has been demanded. In order to cope with the above, attempts at improvement of the piezoelectricity of polymeric piezoelectric materials have been made from various viewpoints.

For example, PVDF and P(VDF-TrFE), which are ferroelectric polymers, have superior piezoelectricity among polymers and a piezoelectric constant $d_{31}$ of 20 pC/N or higher. A film material formed from PVDF or P(VDF-TrFE) is imparted with piezoelectricity by orientating polymer chains by a stretching operation in the stretching direction; then building up opposite electric charges on the back and front sides of the film by means of corona discharge, etc. to generate an electric field perpendicular to the film surface and to orientate permanent dipoles containing fluorine in side chains of the polymer chains parallel to the electric field. However, there has been a problem in view of practical use that the orientation of permanent dipoles achieved by a poling treatment tends to relax, because an opposite electric charge of water or an ion in the air can easily attach to a polarized film surface in the direction of canceling the orientation, and the piezoelectricity declines remarkably with time.

Although PVDF is a material that exhibits the highest piezoelectricity among the above described polymeric piezoelectric materials, its dielectric constant is 13 and relatively high among polymeric piezoelectric materials, and therefore the piezoelectric g constant (open circuit voltage per unit stress), which is a value obtained by dividing a piezoelectric d constant by a dielectric constant, becomes small. In addition, although PVDF exhibits favorable conversion efficiency from electricity to sound, improvement in the conversion efficiency from sound to electricity has been looked for.

In recent years, use of a polymer having optical activity, such as polypeptide and polylactic acid, has drawn attention in addition to the above polymeric piezoelectric materials. A polylactic acid-type polymer is known to exhibit piezoelectricity by a simple mechanical stretching operation. Among polymers having optical activity, the piezoelectricity of a polymer crystal, such as polylactic acid, results from permanent dipoles of C=O bonds existing in the screw axis direction. Especially, polylactic acid, in which the volume fraction of side chains with respect to a main chain is small and the content of permanent dipoles per volume is large, thereby constituting a sort of ideal polymer among polymers having helical chirality. Polylactic acid exhibiting piezoelectricity only by a stretching treatment does not require a poling treatment and is known to maintain the piezoelectric modulus without decrease for several years.

Since polylactic acid exhibits various piezoelectric properties as described above, various polymeric piezoelectric materials using polylactic acid have been reported. For example, a polymeric piezoelectric material exhibiting a piezoelectric modulus of approximately 10 pC/N at normal temperature, which is attained by a stretching treatment of a molding of polylactic acid, has been disclosed (e.g., see Japanese Patent Application Laid-Open (JP-A) No. H5-152638). Further, it has been also reported that high piezoelectricity of approximately 18 pC/N can be achieved by a special orientation method called as a forging process for orientating highly polylactic acid crystals (e.g., see JP-A-2005-213376).

SUMMARY OF INVENTION

Technical Problem

However, since piezoelectric materials (films) described in JP-A-No. H5-152638, and JP-A-No. 2005-213376 are produced by stretching principally uniaxially, they are easily torn parallel to the stretching direction, and they have a drawback in that the tear strength in a certain direction is low. The tear strength in a certain direction is hereinafter also referred to as "longitudinal tear strength".

Further, the transparency of any of the piezoelectric materials described in JP-A-No. H5-152638, and JP-A-No. 2005-213376 is insufficient The present invention has been made in view of the above circumstances and provides a polymeric piezoelectric material which has a high piezoelectric constant $d_{14}$, which is superior in transparency, and in which deterioration of the longitudinal tear strength is suppressed; and a process for producing the same.

Solution to Problem

Specific measures to attain the object are as follows.
[1] A polymeric piezoelectric material comprising a helical chiral polymer having a weight-average molecular weight of from 50,000 to 1,000,000 and having optical activity, wherein a crystallinity of the material measured by a DSC method is from 20% to 80%, and a product of a standardized molecular orientation MORc measured by a microwave transmission type molecular orientation meter based on a reference thickness of 50 μm and the crystallinity is from 25 to 250.

[2] The polymeric piezoelectric material according to [1], wherein the crystallinity is 40.8% or less.

[3] The polymeric piezoelectric material according to [1] or [2], wherein an internal haze with respect to visible light is 40% or less.

[4] The polymeric piezoelectric material according to any one of [1] to [3], wherein the standardized molecular orientation MORc is from 1.0 to 15.0.

[5] The polymeric piezoelectric material according to any one of [1] to [4], wherein a piezoelectric constant $d_{14}$ measured by a displacement method at 25° C. is 1 pm/V or higher.

[6] The polymeric piezoelectric material according to any one of [1] to [5], wherein the helical chiral polymer is a polylactic acid-type polymer having a main chain comprising a repeating unit represented by the following formula (1):

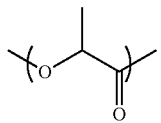

(1)

[7] The polymeric piezoelectric material according to any one of [1] to [6], wherein an optical purity of the helical chiral polymer is 95.00% ee or higher.

[8] The polymeric piezoelectric material according to any one of [1] to [7], wherein a content of the helical chiral polymer is 80 mass % or more.

[9] The polymeric piezoelectric material according to any one of [1] to [8], wherein an internal haze with respect to visible light is 1.0% or less.

[10] A process for producing the polymeric piezoelectric material according to any one of [1] to [9], comprising a first step of heating a sheet in an amorphous state containing the helical chiral polymer to obtain a pre-crystallized sheet, and a second step of stretching the pre-crystallized sheet simultaneously in biaxial directions.

[11] The process for producing the polymeric piezoelectric material according to [10], wherein, in the first step for obtaining the pre-crystallized sheet, the sheet in an amorphous state is heated at a temperature T satisfying the following formula until the crystallinity becomes between 1% and 70%:

Tg−40° C.≤T≤Tg+40° C.

wherein Tg represents a glass transition temperature of the helical chiral polymer.

[12] The process for producing the polymeric piezoelectric material according to [10] or [11], wherein, in the first step for obtaining the pre-crystallized sheet, the sheet in an amorphous state containing polylactic acid as the helical chiral polymer is heated at from 20° C. to 170° C. for from 5 sec to 60 min.

[13] The process for producing the polymeric piezoelectric material according to any one of [10] to [12], wherein an annealing treatment is conducted after the second step.

Advantageous Effects of Invention

By virtue of the present invention, a polymeric piezoelectric material which has a high piezoelectric constant $d_{14}$, which is superior in transparency, and in which deterioration of the longitudinal tear strength is suppressed; and a process for producing the same can be provided.

DESCRIPTION OF EMBODIMENTS

A polymeric piezoelectric material according to the present invention contains a helical chiral polymer with the weight-average molecular weight from 50,000 to 1,000,000 having optical activity (hereinafter also referred to as "optically active polymer"), wherein the crystallinity measured by a DSC method is from 20% to 80%; and the product of a standardized molecular orientation MORc measured by a microwave transmission type molecular orientation meter based on a reference thickness of 50 μm and the crystallinity is from 25 to 250.

According to the composition, a polymeric piezoelectric material can have a high piezoelectric constant $d_{14}$, be superior in the transparency, and deterioration of the longitudinal tear strength (the tear strength in a certain direction) therein can be suppressed.

More particularly, a polymeric piezoelectric material with the above composition can suppress a phenomenon of deterioration of the longitudinal tear strength (the tear strength in a certain direction) while maintaining high piezoelectricity (high piezoelectric constant $d_{14}$) and high transparency by choosing the crystallinity in a range from 20% to 80% and the product of the MORc and the crystallinity from 25 to 250.

That the tear strength in a certain direction deteriorates is occasionally expressed herein as "longitudinal tear strength deteriorates", and a situation where the tear strength in a certain direction is low, is occasionally expressed herein as "longitudinal tear strength is low".

Further, that a phenomenon of deterioration of the tear strength in a certain direction is suppressed, is occasionally expressed herein as "longitudinal tear strength is improved", and a situation where the the phenomenon of deterioration of the tear strength in a certain direction is suppressed, is occasionally expressed as "longitudinal tear strength is high" or "superior in longitudinal tear strength".

In the current embodiment, a "piezoelectric constant $d_{14}$" is a kind of tensor of a piezoelectric modulus and determined from the degree of polarization appeared in the direction of shear stress, when the shear stress is applied in the direction of the stretching axis of a stretched material. Specifically, the appeared electric charge density per unit shear stress is defined as $d_{14}$. A higher value of the piezoelectric constant $d_{14}$ means that piezoelectricity is the higher. An abbreviated expression of "piezoelectric constant" means herein a "piezoelectric constant $d_{14}$".

Meanwhile, a piezoelectric constant $d_{14}$ is a value determined by the following method.

Namely, a rectangular film with a longer direction inclined to 45° from the stretching direction is used as a specimen. Electrode layers are formed on the entire surfaces of both sides of the principal plane of the specimen. The amount of strain in the longer direction of the film caused by impressing the electrodes with application voltage E(V) is regarded as X. Regarding the quotient of application voltage E(V) divided by film thickness t (m) as electric field strength E (V/m), and the amount of strain in the longer direction of the film caused by the application voltage E(V) as X, $d_{14}$ is a value defined as 2× amount of strain X/electric field strength E (V/m).

A complex piezoelectric modulus $d_{14}$ is calculated as $d_{14} = d_{14}' - id_{14}''$, wherein $d_{14}'$ and $d_{14}''$ are obtained by Rheograph-Solid, Model S-1 (by Toyo Seiki Seisaku-Sho, Ltd.). $d_{14}'$ represents the real part of a complex piezoelectric modulus, $id_{14}''$ represents the imaginary part of a complex piezoelectric modulus, and $d_{14}'$ (the real part of the complex piezoelectric modulus) corresponds to the piezoelectric constant $d_{14}$ of the current embodiment. A higher value of the real part of a complex piezoelectric modulus means that the piezoelectricity is the better.

There are a piezoelectric constant $d_{14}$ measured by a displacement method (unit: pm/V) and the same measured by a resonance method (unit: pC/N).

[Helical Chiral Polymer Having Optical Activity]

A helical chiral polymer having optical activity refers to a polymer having a helical molecular structure and having molecular optical activity.

Hereinafter, a helical chiral polymer with the weight-average molecular weight from 50,000 to 1,000,000 having optical activity is also referred to as an "optically active polymer".

Examples of the optically active polymer include polypeptide, cellulose, a cellulose derivative, a polylactic acid-type resin, polypropylene oxide, and poly(β-hydroxybutyric acid). Examples of the polypeptide include poly(γ-benzyl glutarate), and poly(γ-methyl glutarate). Examples of the cellulose derivative include cellulose acetate, and cyanoethyl cellulose.

The optical purity of the optically active polymer is preferably 95.00% ee or higher, more preferably 99.00% ee or higher, and further preferably 99.99% ee or higher from a viewpoint of enhancing the piezoelectricity of a polymeric piezoelectric material. Ideally it is 100.00% ee. It is presumed that, by selecting the optical purity of the optically active polymer in the above range, packing of a polymer crystal exhibiting piezoelectricity becomes denser and as the result the piezoelectricity is improved.

The optical purity of the optically active polymer in the current embodiment is a value calculated according to the following formula:

Optical purity (% ee)=100×|L-form amount−D-form amount..|/(L-form amount+D-form amount);

namely the value of "the difference (absolute value) between L-form amount [mass-%] of the optically active polymer and D-form amount [mass-%] of the optically active polymer" divided by "the total of L-form amount [mass-%] of the optically active polymer and D-form amount [mass-%] of the optically active polymer" multiplied by "100" is defined as optical purity.

In this regard, for the L-form amount [mass-%] of the optically active polymer and the D-form amount [mass-%] of the optically active polymer, values to be obtained by a method using high performance liquid chromatography (HPLC) are used. Specific particulars with respect to a measurement will be described below.

Among the above optically active polymers, a compound with the main chain containing a repeating unit according to the following formula (1) is preferable from a viewpoint of enhancement of the optical purity and improving the piezoelectricity.

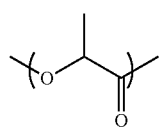

(1)

As an example of a compound with the main chain containing a repeating unit according to the formula (1) is named a polylactic acid-type resin. Among others, polylactic acid is preferable, and a homopolymer of L-lactic acid (PLLA) or a homopolymer of D-lactic acid (PDLA) is most preferable.

The polylactic acid-type resin means "polylactic acid", a "copolymer of one of L-lactic acid or D-lactic acid, and a copolymerizable multi-functional compound", or a mixture of the two. The "polylactic acid" is a polymer linking lactic acid by polymerization through ester bonds into a long chain, and it is known that polylactic acid can be produced by a lactide process via a lactide, a direct polymerization process, by which lactic acid is heated in a solvent under a reduced pressure for polymerizing while removing water, or the like. Examples of the "poly(lactic acid)" include a homopolymer of L-lactic acid, a homopolymer of D-lactic acid, a block copolymer including a polymer of at least one of L-lactic acid and D-lactic acid, and a graft copolymer including a polymer of at least one of L-lactic acid and D-lactic acid.

Examples of the "copolymerizable multi-functional compound" include a hydroxycarboxylic acid, such as glycolic acid, dimethylglycolic acid, 3-hydroxybutyric acid, 4-hydroxybutyric acid, 2-hydroxypropanoic acid, 3-hydroxypropannoic acid, 2-hydroxyvaleric acid, 3-hydroxyvaleric acid, 4-hydroxyvaleric acid, 5-hydroxyvaleric acid, 2-hydroxycaproic acid, 3-hydroxycaproic acid, 4-hydroxycaproic acid, 5-hydroxycaproic acid, 6-hydroxycaproic acid, 6-hydroxymethylcaproic acid, and mandelic acid; a cyclic ester, such as glycolide, β-methyl-δ-valerolactone, γ-valerolactone, and ε-caprolactone; a polycarboxylic acid, such as oxalic acid, malonic acid, succinic acid, glutaric acid, adipic acid, pimelic acid, azelaic acid, sebacic acid, undecanedioic acid, dodecanedioic acid, and terephthalic acid, and an anhydride thereof; a polyhydric alcohol, such as ethylene glycol, diethylene glycol, triethylene glycol, 1,2-propanediol, 1,3-propanediol, 1,3-butanediol, 1,4-butanediol, 2,3-butanediol, 1,5-pentanediol, 1,6-hexanediol, 1,9-nonanediol, 3-methyl-1,5-pentanediol, neopentylglycol, tetramethylene glycol, and 1,4-hexanedimethanol; a polysaccharide such as cellulose; and an aminocarboxylic acid such as α-amino acid.

Examples of the "copolymer of one of L-lactic acid or D-lactic acid, and a copolymerizable multi-functional compound" include a block copolymer or a graft copolymer having a polylactic acid sequence, which can form a helical crystal.

The concentration of a structure derived from a copolymer component in the optically active polymer is preferably 20 mol % or less. For example, if the optically active polymer is a polylactic acid-type polymer, with respect to the total number of moles of a structure derived from lactic acid and a structure derived from a compound copolymerizable with lactic acid (copolymer component) in the polylactic acid-type polymer, the copolymer component is preferably 20 mol % or less.

The optically active polymer (for example, polylactic acid-type resin) can be produced, for example, by a process for obtaining the polymer by direct dehydration condensation of lactic acid, as described in JP-A-S59-096123 and JP-A-H7-033861, or a process for obtaining the same by a ring-opening polymerization of lactide, which is a cyclic dimer of lactic acid, as described in U.S. Pat. Nos. 2,668,182 and 4,057,357.

In order to make the optical purity of the optically active polymer (for example, polylactic acid-type resin) obtained by any of the production processes to 95.00% ee or higher, for example, if a polylactic acid is produced by a lactide process, it is preferable to polymerize lactide, whose optical purity has been enhanced to 95.00% ee or higher by a crystallization operation.

[Weight-Average Molecular Weight of Optically Active Polymer]

The weight-average molecular weight (Mw) of the optically active polymer according to the current embodiment is from 50,000 to 1,000,000. If the lower limit of the weight-average molecular weight of the optically active polymer is less than 50,000, the mechanical strength of a molding from the optically active polymer becomes insufficient. The lower limit of the weight-average molecular weight of the optically active polymer is preferably 100,000 or higher, and more preferably 150,000 or higher. Meanwhile, if the upper limit of the weight-average molecular weight of the optically active polymer exceeds 1,000,000, molding of the optically active polymer (for example, by extrusion molding, etc. to a film form, etc.) becomes difficult.

The upper limit of the weight-average molecular weight is preferably 800,000 or less, and more preferably 300,000 or less.

Further, the molecular weight distribution (Mw/Mn) of the optically active polymer is preferably from 1.1 to 5, more preferably from 1.2 to 4, and further preferably from 1.4 to 3, from a viewpoint of the strength of a polymeric piezoelectric material. The weight-average molecular weight Mw and the molecular weight distribution (Mw/Mn) of a polylactic acid-type polymer are measured using a gel permeation chromatograph (GPC) by the following GPC measuring method.

GPC Measuring Apparatus:
  GPC-100 by Waters Corp.
Column:
  SHODEX LF-804 by Showa Denko K.K.
Preparation of Sample:
  A polylactic acid-type polymer is dissolved in a solvent (e.g. chloroform) at 40° C. to prepare a sample solution with the concentration of 1 mg/mL.
Measurement Condition:
  A sample solution 0.1 mL is introduced into the column at a temperature of 40° C. and a flow rate of 1 mL/min by using chloroform as a solvent.

The sample concentration in a sample solution separated by the column is measured by a differential refractometer. Based on polystyrene standard samples, a universal calibration curve is created and the weight-average molecular weight (Mw) and the molecular weight distribution (Mw/Mn) of a polylactic acid-type polymer are calculated.

For a polylactic acid-type polymer, a commercial polylactic acid may be used, and examples thereof include PURASORB (PD, PL) by Purac Corporate, LACEA (H-100, H-400) by Mitsui Chemicals, Inc., and Ingeo 4032D, 4043D by NatureWorks LLC.

If a polylactic acid-type resin is used as the optically active polymer and in order to make the weight-average molecular weight (Mw) of the polylactic acid-type resin 50,000 or higher, it is preferable to produce the optically active polymer by a lactide process, or a direct polymerization process.

A polymeric piezoelectric material of the current embodiment may contain only one kind of the optically active polymer, or may contain two or more kinds thereof.

Although there is no particular restriction on a content of the optically active polymer (if two or more kinds are used, the total content; hereinafter holds the same) in a polymeric piezoelectric material of the current embodiment, 80 mass % or more with respect to the total mass of the polymeric piezoelectric material is preferable.

If the content is 80 mass % or more, the piezoelectric constant tends to improve.

[Other Components]

A polymeric piezoelectric material of the current embodiment may contain, to the extent that the advantage of the current embodiment be not compromised, components other than the optically active polymers (for example, publicly known resins, as represented by polyvinylidene fluoride, a polyethylene resin and a polystyrene resin, inorganic fillers, such as silica, hydroxyapatite, and montmorillonite, and publicly known crystal nucleating agents such as phthalocyanine).

Further, from a viewpoint of better inhibition of a structural change by hydrolysis, etc. a polymeric piezoelectric material of the current embodiment should preferably contain a stabilizing agent such as a carbodiimide compound as represented by CARBODILITE (registered trade mark).

Further, to the extent that the advantage of the current embodiment is not compromised, a polymeric piezoelectric material of the current embodiment may contain a helical chiral polymer other than the afore-described optically active polymer (namely, a helical chiral polymer having a weight-average molecular weight (Mw) from 50,000 to 1,000,000 and having optical activity).

-Inorganic Filler-

A polymeric piezoelectric material of the current embodiment may contain at least one kind of inorganic filler.

For example, in order to form a polymeric piezoelectric material to a transparent film inhibiting generation of a void such as an air bubble, an inorganic filler such as hydroxyapatite may be dispersed into a polymeric piezoelectric material in a nano-state. However for dispersing the inorganic filler into a nano-state, large energy is required to disintegrate an aggregate, and if the inorganic filler is not dispersed in a nano-state the film transparency may occasionally be compromised. Therefore, if a polymeric piezoelectric material according to the current embodiment contains an inorganic filler, the content of the inorganic filler with respect to the total mass of the polymeric piezoelectric material is preferably less than 1 mass-%.

Further, if a polymeric piezoelectric material contains components other than the optically active polymer, the content of the components other than the optically active polymer is preferably 20 mass % or less, and more preferably 10 mass % or less with respect to the total mass of the polymeric piezoelectric material.

-Crystallization Accelerator (Crystal Nucleating Agent)-

A polymeric piezoelectric material of the current embodiment may contain at least one kind of crystallization accelerator (crystal nucleating agent).

Although there is no particular restriction on a crystallization accelerator (crystal nucleating agent) insofar as a crystallization accelerating effect can be recognized, it is preferable to select a substance with the crystal structure having lattice spacing close to the lattice spacing of the crystal lattice of the optically active polymer. This is because a substance having closer lattice spacing has the higher activity as a nucleating agent. For example, when the polylactic acid-type resin is used as the optically active polymer, examples include an organic substance, such as zinc phenylsulfonate, melamine polyphosphate, melamine cyanurate, zinc phenylphosphonate, calcium phenylphosphonate, and magnesium phenylphosphonate, and an inorganic substance, such as talc and clay. Among others, zinc phenylphosphonate, which has lattice spacing closest to the lattice spacing of polylactic acid and exhibits excellent crystallization accelerating activity, is preferable. Meanwhile, a commercial product can be used as a crystallization accelerator. Specific examples thereof include ECOPROMOTE (zinc phenylphosphonate: by Nissan Chemical Ind., Ltd.).

The content of a crystal nucleating agent with respect to 100 parts by mass of the optically active polymer is normally from 0.01 to 1.0 part by mass, preferably from 0.01 to 0.5 parts by mass, and from a viewpoint of better crystallization accelerating activity and maintenance of a biomass ratio especially preferably from 0.02 to 0.2 parts by mass.

If the content of a crystal nucleating agent is 0.01 parts by mass or more, the crystallization accelerating effect can be attained more effectively. If the content of a crystal nucleating agent is less than 1.0 part, the crystallization speed can be regulated more easily.

From a viewpoint of transparency, the polymeric piezoelectric material should preferably not contain a component other than a helical chiral polymer having optical activity.

[Structure]

In a polymeric piezoelectric material of the current embodiment, optically active polymers are orientated.

Molecular orientation ratio MOR is used as an index representing the orientation. Namely, the molecular orientation ratio (MOR) is a value indicating the degree of molecular orientation, and measured by the following microwave measurement method. Namely, a sample (film) is placed in a microwave resonant waveguide of a well known microwave molecular orientation ratio measuring apparatus (also referred to as a "microwave transmission-type molecular orientation meter") such that the sample plane (film plane) is arranged perpendicular to the travelling direction of the microwaves. Then, the sample is continuously irradiated with microwaves whose oscillating direction is biased unidirectionally, while maintaining such conditions, the sample is rotated in a plane perpendicular to the travelling direction of the microwaves from 0 to 360°, and the intensity of the microwaves passed through the sample is measured to determine the molecular orientation ratio MOR.

Standardized molecular orientation MORc in the current embodiment means a MOR value to be obtained at the reference thickness tc of 50 μm, and can be determined by the following formula.

$$MORc=(tc/t) \times (MOR-1)+1$$

(tc: Reference thickness corrected to; t: Sample thickness)

A standardized molecular orientation MORc can be measured by a publicly known molecular orientation meter, e.g. a microwave-type molecular orientation analyzer MOA-2012A or MOA-6000 by Oji Scientific Instruments, at a resonance frequency in the vicinity of 4 GHz or 12 GHz.

The standardized molecular orientation MORc can be regulated by crystallization conditions (for example, heating temperature and heating time) and stretching conditions (for example, stretching temperature and stretching speed) in producing a polymeric piezoelectric material.

Standardized molecular orientation MORc can be converted to birefringence Δn, which equals to retardation divided by film thickness.

More specifically, the retardation can be measured by RETS100, by Otsuka Electronics Co., Ltd. Further, MORc and Δn are approximately in a linearly proportional relationship, and if Δn is 0, MORc is 1.

<Physical Properties of Polymeric Piezoelectric Material>

A polymeric piezoelectric material of the current embodiment has a high piezoelectric constant (a piezoelectric constant $d_{14}$ measured by a displacement method at 25° C. is preferably 1 pm/V or higher) and is superior in transparency, and longitudinal tear strength.

[Piezoelectric Constant (Displacement Method)]

The piezoelectric constant of a polymeric piezoelectric material in the current embodiment is a value measured as follows.

Firstly, a polymeric piezoelectric material is cut into a size of 40 mm in the stretching direction (MD direction) and 40 mm in the direction perpendicular to the stretching direction (TD direction) respectively to prepare a rectangular specimen. Then the prepared specimen is set on a stage of a sputtering thin-film formation apparatus JSP-8000 by Ulvac Inc., and the inside of a coater chamber is evacuated to a vacuum state by a rotary pump (for example, $10^{-3}$ Pa or less). Then a sputtering treatment is conducted for 500 sec on a plane of the specimen under the conditions of an Ag (silver) target at an applied voltage of 280 V and a sputtering current of 0.4 A. Then a sputtering treatment is carried out on the other plane under the same conditions for 500 sec, thereby forming Ag coats on both the planes of the specimen and completing Ag conductive layers.

A specimen (a polymeric piezoelectric material) of 40 mm×40 mm with the Ag conductive layers on both planes thus formed is cut to a length of 32 mm in the direction of 45° with respect to the stretching direction (MD direction) of a polymeric piezoelectric material, and to 5 mm in the direction perpendicular to the above 45° direction, to cut out a piece of rectangular film in a size of 32 mm×5 mm. This is used as a sample for measuring the piezoelectric constant.

A sine-wave alternating voltage of 10 Hz and 300 Vpp is applied to the prepared sample, and a difference distance between the maximum value and the minimum value of the displacement of the film is measured by a laser spectral-interference displacement meter SI-1000 (by Keyence Corporation).

A value obtained by dividing the measured displacement (mp-p) by the reference length of the film, which is 30 mm, is defined as strain, and a value obtained by dividing the strain by an electric field intensity applied to the film ((applied voltage (V))/(film thickness)) and multiplying by 2, is defined as piezoelectric constant $d_{14}$.

A higher piezoelectric constant results in the larger displacement of a polymeric piezoelectric material responding to a voltage applied to the material, and reversely the higher voltage generated responding to a force applied to a polymeric piezoelectric material, and therefore is advantageous as a polymeric piezoelectric material.

Specifically, the piezoelectric constant $d_{14}$ measured by a displacement method at 25° C. is preferably 1 pm/V or higher, more preferably 3 pm/V or higher, further preferably 4 pm/V or higher. Although there is no particular upper limit of the piezoelectric constant, it is preferably 50 pm/V or less, and sometimes more preferably 30 pm/V or less, for a piezoelectric material using a helical chiral polymer from a viewpoint of the balance with transparency, etc. as described below.

Similarly, from a viewpoint of the balance with transparency, the piezoelectric constant $d_{14}$ measured by a resonance method is preferably 15 pC/N or less.

"MD direction" means herein a flow direction of a film (Machine Direction), and "TD direction" means a direction orthogonal to the MD direction and parallel to the principal plane of the film (Transverse Direction).

[Crystallinity]

The crystallinity of a polymeric piezoelectric material is determined by a DSC method, and the crystallinity of a polymeric piezoelectric material of the current embodiment is from 20% to 80%, and preferably from 30% to 70%. If the crystallinity is within the range, the balance among the piezoelectricity, the transparency and the longitudinal tear strength of a polymeric piezoelectric material may be favorable, and whitening or breakage is less likely to occur in stretching the polymeric piezoelectric material, and therefore production is easy.

Specifically, if the crystallinity is less than 20%, the piezoelectricity tends to deteriorate.

If the crystallinity exceeds 80%, the longitudinal tear strength and the transparency tend to deteriorate.

From a viewpoint of improving further the longitudinal tear strength and the transparency, the crystallinity is preferably 40.8% or less and especially 40.0% or less.

In the current embodiment the crystallinity of a polymeric piezoelectric material can be regulated within a range from 20% to 80% by regulating, for example, conditions for crystallization and stretching in producing a polymeric piezoelectric material.

[Transparency (Internal Haze)]

The transparency of a polymeric piezoelectric material can be evaluated, for example, by visual observation or haze measurement.

The internal haze of a polymeric piezoelectric material with respect to visible light is preferably 40% or less. In this regard, the internal haze is a value measured for a polymeric piezoelectric material with the thickness from 0.03 mm to 0.05 mm using a haze meter (TC-HIII DPK, by Tokyo Denshoku Co., Ltd.) at 25° C. according to JIS-K7105, and details of the measuring method are described in Examples below.

The internal haze of a polymeric piezoelectric material is preferably not more than 20% and more preferably not more than 5%. Further, from a viewpoint of improvement of longitudinal tear strength, the internal haze of a polymeric piezoelectric material is preferably not more than 2.0% and especially preferably not more than 1.0%.

Further, the lower the internal haze, the better a polymeric piezoelectric material is. However, from a viewpoint of the balance with the piezoelectric constant, etc. the internal haze is preferably from 0.0% to 40%, more preferably from 0.01% to 20%, further preferably from 0.01% to 5%, further preferably from 0.01% to 2.0%, and especially preferably from 0.01% to 1.0%.

Incidentally, "internal haze" means herein the internal haze of a polymeric piezoelectric material according to the present invention. The internal haze is a haze from which a haze caused by the shape of an external surface of the polymeric piezoelectric material is excluded, as described in an Example below.

[Standardized Molecular Orientation MORc]

The standardized molecular orientation MORc of a polymeric piezoelectric material of the current embodiment is preferably from 1.0 to 15.0, and more preferably from 4.0 to 10.0.

If the standardized molecular orientation MORc is 1.0 or more, a large number of molecular chains of the optically active polymer (for example, poly(lactic acid) molecular chains) are aligned in the stretching direction, and as the result a higher rate of generation of oriented crystals can be attained to exhibit higher piezoelectricity.

If the standardized molecular orientation MORc is 15.0 or less, the longitudinal tear strength can be improved.

[Product of Standardized Molecular Orientation MORc and Crystallinity]

The product of the crystallinity and the standardized molecular orientation MORc of a polymeric piezoelectric material in the the current embodiment is from 25 to 250. By regulation within the range, high piezoelectricity and high transparency can be maintained and deterioration of the longitudinal tear strength (namely, tear strength in a certain direction) can be suppressed.

If the product of the crystallinity and the standardized molecular orientation MORc of a polymeric piezoelectric material is less than 25, the piezoelectricity tends to deteriorate.

If the product of the crystallinity and the standardized molecular orientation MORc of a polymeric piezoelectric material exceeds 250, the longitudinal tear strength and the transparency tend to deteriorate.

The product of the crystallinity and the MORc is more preferably from 50 to 200, and further preferably from 100 to 190.

In the current embodiment the product of the crystallinity and the standardized molecular orientation MORc of a polymeric piezoelectric material can be regulated within a range from 25 to 250 by regulating conditions for crystallization and stretching in producing a polymeric piezoelectric material.

[Longitudinal Tear Strength]

The longitudinal tear strength of a polymeric piezoelectric material of the current embodiment is evaluated based on the tear strength measured according to the "Right angled tear method" stipulated in JIS K 7128-3 "Plastics—Tear strength of films and sheets".

In this regard, the crosshead speed of a tensile testing machine is set at 200 m/min and tear strength is calculated according to the following formula:

$$T=F/d$$

wherein T stands for the tear strength (N/mm), F for the maximum tear load, and d for the thickness (mm) of a specimen.

[Dimensional Stability]

It is preferable that the dimensional change rate of a polymeric piezoelectric material under heat is low, especially at a temperature of an environment where devices or apparatus described below, such as a loudspeaker and a touch panel, incorporating the material are used. Because, if the dimension of a piezoelectric material changes in a service environment of a device, positions of wiring, etc. connected with the piezoelectric material are moved, which may cause malfunctioning of the device. The dimensional stability of a polymeric piezoelectric material is evaluated by a dimensional change rate before and after a heat treatment for 10 min at 150° C., which is a temperature slightly higher than the service environment of a device as described below. The dimensional change rate is preferably 10% or less, and more preferably 5% or less.

[Production of Polymeric Piezoelectric Material]

There is no particular restriction on a process for producing a polymeric piezoelectric material according to the present invention, insofar as the crystallinity can be regulated from 20% to 80% and the product of the standardized molecular orientation MORc and the crystallinity can be regulated from 25 to 250.

As such a process, a process, by which a sheet in an amorphous state containing the optically active polymer as described above is subjected to crystallization and stretching (either may be earlier) can be applied, and by regulating the respective conditions for the crystallization and the stretching the crystallinity can be regulated from 20% to 80% and the product of the standardized molecular orientation MORc and the crystallinity can be regulated from 25 to 250, can be used.

The term "crystallization" herein is a concept including pre-crystallization described below and an annealing treatment described below.

A sheet in an amorphous state means a sheet obtained by heating a simple optically active polymer or a mixture containing the optically active polymer to a temperature equal to or above the melting point Tm of the optically active polymer and then quenching the same. The quenching temperature is for example 50° C.

In a process for producing a polymeric piezoelectric material according to the present invention, the optically active polymer (polylactic acid-type polymer, etc.) may be used singly, or a mixture of two or more optically active polymers (polylactic acid-type polymers, etc.) described above or a mixture of at least one optically active polymer described above and at least one other component may be used as a raw material for a polymeric piezoelectric material (or a sheet in an amorphous state).

The mixture is preferably a mixture obtained by melt-kneading.

Specifically, when two or more optically active polymers are mixed, or at least one optically active polymer and another component (for example, the inorganic filler and the crystal nucleating agent) are mixed, optically active polymer(s) to be mixed (according to need, together with another component) are melt-kneaded in a melt-kneading machine (LABO PLASTOMILL mixer, by Toyo Seiki Seisaku-sho, Ltd.) under conditions of the mixer rotating speed of from 30 rpm to 70 rpm at from 180° C. to 250° C. for from 5 min to 20 min to obtain a blend of plural kinds of optically active polymers or a blend of an optically active polymer and another component such as an inorganic filler.

Embodiments of a process for producing a polymeric piezoelectric material according to the present invention will be described below, provided that a process for producing a polymeric piezoelectric material according to the present invention is not limited to the following embodiments.

-First Embodiment-

The first embodiment of a process for producing a polymeric piezoelectric material according to the present invention includes, for example, a first step of heating a sheet in an amorphous state containing the optically active polymer (namely, a helical chiral polymer with the weight-average molecular weight from 50,000 to 1,000,000 having optical activity) to obtain a pre-crystallized sheet, and a second step of stretching the pre-crystallized sheet in biaxial directions (for example, while stretching mainly in a uniaxial direction, simultaneously or successively stretched in a direction different from said stretching direction).

Generally, by intensifying a force applied to a film during stretching, there appears tendency that the orientation of optically active polymers is promoted, and the piezoelectric constant is enhanced, meanwhile, crystallization is progressed to increase the crystal size, and consequently the internal haze also increases. Further, as the result of increase in internal stress, the rate of dimensional change tends to increase. If a force is applied simply to a film, not oriented crystals, such as spherocrystals, are formed. Poorly oriented crystals such as spherocrystals increase the internal haze but hardly contribute to increase in the piezoelectric constant.

Therefore to produce a film having a high piezoelectric constant, and low internal haze, it is preferable to form efficiently such micro-sized orientated crystals, as contribute to the piezoelectric constant but not increase the internal haze.

From the above, for example, by producing a pre-crystallized sheet having minute crystals (crystallites) formed by pre-crystallization in a sheet prior to stretching and then stretching the pre-crystallized sheet, a force of stretching can be acted efficiently on a low-crystallinity polymer part between a crystallite and a crystallite inside the pre-crystallized sheet. By this, the optically active polymer can be oriented efficiently in a principal stretching direction.

Specifically, by stretching the pre-crystallized sheet, minute orientated crystals are formed in a low-crystallinity polymer part between a crystallite and a crystallite and at the same time spherocrystals formed by pre-crystallization are collapsed and lamellar crystals constituting the spherocrystals are aligned as tied in a row by tie-molecular chains in the stretching direction. By this, a desired MORc value can be attained.

As the result, by stretching the pre-crystallized sheet, a sheet with a low internal haze value can be obtained without compromising remarkably the piezoelectric constant. Further, by regulating the production conditions a polymeric piezoelectric material superior in dimensional stability can be obtained.

However, according to the method of stretching a pre-crystallized sheet, since polymer chains in a low-crystallinity part inside a pre-crystallized sheet are disentangled and aligned in a stretching direction by stretching, the tear strength against a force from a direction nearly orthogonal to the stretching direction is improved, but reversely the tear strength against a force from a direction nearly parallel to the stretching direction may be deteriorated.

In view of the above, the constitution of the first embodiment includes a first step of heating a sheet in an amorphous state containing the optically active polymer to obtain a pre-crystallized sheet, and a second step of stretching the pre-crystallized sheet in biaxial directions.

In the first embodiment, when the pre-crystallized sheet is stretched in the second step (stretching step) in order to improve the piezoelectricity (also referred to as "principal stretching"), the pre-crystallized sheet is stretched simultaneously or successively in a direction crossing the stretching direction of the principal stretching (also referred to as "secondary stretching") to perform biaxial stretching. This can align molecular chains in the sheet not only in the direction of the principal stretching axis but also in the direction crossing the principal stretching axis, and as a consequence the product of the standardized molecular orientation MORc and the crystallinity can be regulated appropriately within a certain range (specifically from 25 to 250).

As the result, while maintaining the transparency, the piezoelectricity can be enhanced, and further the longitudinal tear strength can be improved.

For the control of standardized molecular orientation MORc, it is important to regulate the heating time and the heating temperature for a sheet in an amorphous state in the first step, and the stretching speed and the stretching temperature for a pre-crystallized sheet in the second step.

As described above, the optically active polymer is a polymer having a helical molecular structure and having molecular optical activity.

A sheet in an amorphous state containing the optically active polymer may be those commercially available, or produced by a publicly known film forming process such as an extrusion process. A sheet in an amorphous state may have s single layer or multiple layers.

[First Step (Pre-Crystallization Step)]

The first step in the first embodiment is a step of heating a sheet in an amorphous state containing the optically active polymer to obtain a pre-crystallized sheet.

As a treatment through the first step and the second step in the first embodiment, specifically, it may be: 1) a treatment (off-line treatment) by which a sheet in an amorphous state is heat-treated to a pre-crystallized sheet (up to here the first step), and the obtained pre-crystallized sheet is set in a stretching apparatus and stretched (up to here the second step); or 2) a treatment (in-line treatment) by which a sheet in an amorphous state is set in a stretching apparatus, and heated in the stretching apparatus to a pre-crystallized sheet (up to here the first step), and the obtained pre-crystallized sheet is continuously stretched in the stretching apparatus (up to here the second step).

Although there is no particular restriction on a heating temperature T for pre-crystallizing a sheet in an amorphous state containing the optically active polymer in the first step, from viewpoints of enhancing the piezoelectricity, the transparency, etc. of a polymeric piezoelectric material produced, it should be preferably a temperature set to satisfy the following relational expression with respect to the glass transition temperature Tg of the optically active polymer, and to make the crystallinity from 1% to 70%.

$$Tg-40° C. \leq T \leq Tg+40° C.$$

(Tg stands for the glass transition temperature of the optically active polymer.)

The glass transition temperature Tg [° C.] of the optically active polymer and the melting point Tm [° C.] of the optically active polymer are respectively a glass transition temperature (Tg) obtained as an inflection point of a curve and a temperature (Tm) recognized as a peak value of an endothermic reaction, from a melting endothermic curve obtained for the optically active polymer using the differential scanning calorimeter (DSC) by raising the temperature under a condition of the temperature increase rate of 10° C./min.

The heat treatment time for pre-crystallization in the first step may be so regulated as to satisfy the crystallinity as desired and to make the product of the standardized molecular orientation MORc of a polymeric piezoelectric material after the stretching (after the second step) and the crystallinity of the polymeric piezoelectric material after the stretching from 25 to 250, preferably from 50 to 200, and further preferably from 100 to 190. If the heat treatment time becomes longer, the crystallinity after the stretching becomes higher and the standardized molecular orientation MORc after the stretching becomes also higher. If the heat treatment time becomes shorter, the crystallinity after the stretching becomes also lower and the standardized molecular orientation MORc after the stretching becomes also lower.

If the crystallinity of a pre-crystallized sheet before stretching becomes high, conceivably the sheet becomes stiff and a larger stretching stress is exerted on the sheet, and therefore such parts of the sheet, where the crystallinity is relatively low, are also orientated highly to enhance also the standardized molecular orientation MORc after stretching. Reversely, conceivably, if the crystallinity of a pre-crystallized sheet before stretching becomes low, the sheet becomes soft and a stretching stress is exerted to a lesser extent on the sheet, and therefore such parts of the sheet, where the crystallinity is relatively low, are also orientated weakly to lower also the standardized molecular orientation MORc after stretching.

The heat treatment time varies depending on the heat treatment temperature, the sheet thickness, the molecular weight of a resin constituting a sheet, and the kind and quantity of an additive. If a sheet in an amorphous state is preheated at a temperature allowing the sheet to crystallize on the occasion of preheating which may be carried out before a stretching step (second step) described below, the actual heat treatment time for crystallizing the sheet corresponds to the sum of the above preheating time and the heat treatment time at the pre-crystallization step before the preheating.

The heat treatment time for a sheet in an amorphous state is preferably from 5 sec to 60 min, and from a viewpoint of stabilization of production conditions more preferably from 1 min to 30 min. If, for example, a sheet in an amorphous state containing a polylactic acid resin as the optically active polymer is pre-crystallized, heating at from 20° C. to 170° C. for from 5 sec to 60 min (preferably from 1 min to 30 min) is preferable.

In the first embodiment, for imparting efficiently piezoelectricity, transparency, and longitudinal tear strength to a sheet after stretching, it is preferable to adjust the crystallinity of a pre-crystallized sheet before stretching.

The reason behind the improvement of the piezoelectricity, etc. by stretching is believed to be because stress by stretching is concentrated on parts of a pre-crystallized sheet where the crystallinity is relatively high, which are presumably in a state of spherocrystal, such that spherocrystals are destroyed and aligned to enhance the piezoelectricity (piezoelectric constant $d_{14}$); and because, at the same time, the stretching stress is also exerted on parts where the crystallinity is relatively low through the spherocrystals, such that an orientation of the low crystallinity parts is promoted to enhance the piezoelectricity (piezoelectric constant $d_{14}$).

The crystallinity of a sheet after stretching is set to aim at 20% to 80%, preferably at 30% to 70%. Consequently, the crystallinity of a pre-crystallized sheet just before stretching is set at 1% to 70%, preferably at 2% to 60%. The crystallinity of a pre-crystallized sheet may be carried out similarly as the measurement of the crystallinity of a polymeric piezoelectric material of the current embodiment after stretching.

The thickness of a pre-crystallized sheet is selected mainly according to an intended thickness of a polymeric piezoelectric material to be attained by means of stretching at the second step and the stretching ratio, and is preferably from 50 μm to 1000 μm, and more preferably about from 200 μm to 800 μm.

[Second Step (Stretching Step)]

There is no particular restriction on a stretching process at the second step (stretching step), a process combining stretching for forming oriented crystals (also called as principal stretching) and stretching conducted in a direction crossing the former stretching direction. By stretching a polymeric piezoelectric material, a polymeric piezoelectric material having a large area principal plane can be also obtained.

In this regard, a "principal plane" means among surfaces of a polymeric piezoelectric material a plane with the largest area. A polymeric piezoelectric material according to the present invention may have two or more principal planes. For example, if a polymeric piezoelectric material is a platy body having two planes each of rectangular planes A of 10 mm×0.3 mm, rectangular planes B of 3 mm×0.3 mm, and rectangular planes C of 10 mm×3 mm, the principal plane of the polymeric piezoelectric material is planes C, and there are 2 principal planes.

As for the principal plane area in the current embodiment, the principal plane area of a polymeric piezoelectric material is preferably 5 mm² or more, and more preferably 10 mm² or more.

It is presumed that molecular chains of a polylactic acid-type polymer contained in a polymeric piezoelectric material can be orientated uniaxially and aligned densely to attain higher piezoelectricity, if a polymeric piezoelectric material is stretched mainly uniaxially.

Meanwhile, as described above, if stretched only in one direction, polymer molecular chains in a sheet are aligned mainly in the stretching direction, and therefore the longitudinal tear strength against a force from a direction nearly orthogonal to the stretching direction may deteriorate.

When stretching for increasing the piezoelectricity (also referred to as "principal stretching") is conducted at the stretching step, by stretching a pre-crystallized sheet simultaneously or successively in a direction crossing the stretching direction of the principal stretching (also referred to as "secondary stretching") for performing biaxial stretching, a polymeric piezoelectric material enjoying excellent balance of piezoelectricity, transparency, and longitudinal tear strength can be obtained.

In this regard, "successive stretching" means a stretching process, by which a sheet is first stretched in a uniaxial direction, and then stretched in a direction crossing the first stretching direction.

There is no particular restriction on a process for biaxial stretching in the second step, and a usual process can be applied. Specifically, a combined process of a roll stretching (stretching in the MD direction) and a tenter stretching (stretching in the TD direction) is preferable. In this case, from a viewpoint of production efficiency, the TD direction should preferably be selected for the direction with a higher stretching ratio (for example, principal stretching direction), and the MD direction should preferably be selected for the direction with a lower stretching ratio (for example, secondary stretching direction).

The biaxial stretching may be conducted simultaneously or successively, however it should preferably be conducted simultaneously (namely, simultaneous biaxial stretching).

A reason for simultaneous biaxial stretching being preferable is that, in a case of successive stretching, at the second or later stretching, a force crossing the stretching direction at the first stretching is added, therefore a longitudinal tearing of film may occur during the stretching.

Similarly in a case of successive stretching, from a viewpoint of suppression of the longitudinal tearing of film during the second or later stretching, the ratio of the first stretching should preferably be small.

In this connection, as described above, "MD direction" means the flow direction of a film, and "TD direction" means a direction orthogonal to the MD direction and parallel to the principal plane of the film.

Although there is no particular restriction on the stretching ratio, insofar as the crystallinity of a polymeric piezoelectric material and the product of the MORc and the crystallinity after the stretching (or after the annealing treatment, if the annealing step described below is exercised) can be regulated within the above described range, the stretching ratio of the principal stretching is preferably from 2 to 8-fold, more preferably from 2.5 to 5-fold, and especially preferably from 2.7 to 4.5-fold. The stretching ratio of the secondary stretching is preferably from 1-fold to 4-fold, more preferably from 1.2 to 2.5-fold, and further preferably from 1.2 to 2.3-fold.

Further, there is also no particular restriction on the stretching speed, and usually the principal stretching speed and the secondary stretching speed are regulated according to the ratio. More specifically, if the principal stretching ratio is set at 2-fold the secondary stretching ratio, the principal stretching speed is often set at 2-fold the secondary stretching. The stretching speed may be set at a usually applied speed without particular restriction, and is often regulated to a speed, which does not cause breakage of a film during the stretching.

If a polymeric piezoelectric material is stretched solely by a tensile force as in the cases of a uniaxial stretching process or a biaxial stretching process, the stretching temperature of a polymeric piezoelectric material is preferably in a range of 10° C. to 20° C. higher than the glass transition temperature of a polymeric piezoelectric material.

When a pre-crystallized sheet is stretched, the sheet may be preheated immediately before stretching so that the sheet can be easily stretched.

Since the preheating is performed generally for the purpose of softening the sheet before stretching in order to facilitate the stretching, the same is normally performed avoiding conditions that promote crystallization of a sheet before stretching and make the sheet stiff.

Meanwhile, as described above, in the first embodiment pre-crystallization is performed before stretching, and therefore the preheating may be performed combined with the pre-crystallization. Specifically, by conducting the preheating at a higher temperature than a temperature normally used, or for longer time conforming to the heating temperature or the heat treatment time at the aforementioned pre-crystallized step, preheating and pre-crystallization can be combined.

[Annealing Treatment Step]

From a viewpoint of improvement of the piezoelectric constant, a polymeric piezoelectric material after a stretching treatment should preferably be subjected to a certain heat treatment (hereinafter also referred to as an "annealing treatment"). The temperature of an annealing treatment is preferably about from 80° C. to 160° C. and more preferably from 100° C. to 155° C.

There is no particular restriction on a method for applying a high temperature in an annealing treatment, examples thereof include a direct heating method using a hot air heater or an infrared heater, and a method, for dipping a polymeric piezoelectric material in a heated liquid such as silicone oil. In this case, if a polymeric piezoelectric material is deformed by linear expansion, it becomes practically difficult to obtain a flat film, and therefore high temperature is applied preferably under application of a certain tensile stress (e.g. 0.01 MPa to 100 MPa) on a polymeric piezoelectric material to prevent the polymeric piezoelectric material from sagging.

The high temperature application time at an annealing treatment is preferably from 1 sec to 60 min, more preferably from 1 sec to 300 sec, and further preferable is heating for from 1 sec to 60 sec. If annealing continues beyond 60 min, the degree of orientation may sometimes decrease due to growth of spherocrystals from molecular chains in an amorphous part at a temperature above the glass transition temperature of a polymeric piezoelectric material, and as the result the piezoelectricity may sometimes deteriorate.

A polymeric piezoelectric material treated for annealing as described above is preferably quenched after the annealing treatment.

In connection with an annealing treatment, "quench" means that a polymeric piezoelectric material treated for annealing is dipped, for example, in ice water immediately after the annealing treatment and chilled at least to the glass transition point Tg or lower, and between the annealing treatment and the dipping in ice water, etc. there is no other treatment.

Examples of a quenching method include a dipping method, by which a polymeric piezoelectric material treated for annealing is dipped in a cooling medium, such as water, ice water, ethanol, ethanol or methanol containing dry ice, and liquid nitrogen; a cooling method, by which a liquid with the low vapor pressure is sprayed for chilling by evaporation latent heat thereof.

For chilling continuously a polymeric piezoelectric material, quenching by contacting a polymeric piezoelectric material with a metal roll regulated at a temperature below the glass transition temperature Tg of the polymeric piezoelectric material is possible. The number of quenches may be once or two times or more; or annealing and quenching can be repeated alternately. Further, if a polymeric piezoelectric material having received the stretching treatment is subjected to the annealing, the polymeric piezoelectric material may be shrunk after the annealing compared to before the annealing.

-Second Embodiment-

The second embodiment of a process for producing a polymeric piezoelectric material according to the present invention includes a step of stretching a sheet containing the optically active polymer (preferably a sheet in an amorphous state) mainly in a uniaxial direction and a step of an annealing treatment, in the order mentioned.

In the second embodiment the step of stretching mainly in a uniaxial direction is a step of conducting at least the principal stretching (according to need secondary stretching is further carried out).

The respective conditions for the step of stretching mainly in a uniaxial direction and the step of an annealing treatment in the second embodiment are regulated appropriately so that the crystallinity of a polymeric piezoelectric material to be produced becomes from 20% to 80% and that the product of the standardized molecular orientation MORc and the crystallinity becomes from 25 to 250.

Moreover, preferable conditions for the step of stretching mainly in a uniaxial direction and the step of an annealing treatment in the second embodiment are respectively same as the conditions for the second step and the annealing treatment step in the first embodiment.

In the second embodiment it is not necessary to provide a first step (pre-crystallization step) in the first embodiment.

<Use of Polymeric Piezoelectric Material>

Since the polymeric piezoelectric material according to the present invention is a piezoelectric material having a high piezoelectric constant $d_{14}$ and superior transparency and longitudinal tear strength, as described above, the same can be used in various fields including a loudspeaker, a headphone, a touch panel, a remote controller, a microphone, a hydrophone, an ultrasonic transducer, an ultrasonic applied measurement instrument, a piezoelectric vibrator, a mechanical filter, a piezoelectric transformer, a delay unit, a sensor, an acceleration sensor, an impact sensor, a vibration sensor, a pressure-sensitive sensor, a tactile sensor, an electric field sensor, a sound pressure sensor, a display, a fan, a pump, a variable-focus mirror, a sound insulation material, a soundproof material, a keyboard, acoustic equipment, information processing equipment, measurement equipment, and a medical appliance.

In this case, a polymeric piezoelectric material according to the present invention is preferably used as a piezoelectric element having at least two planes provided with electrodes. It is enough if the electrodes are provided on at least two planes of the polymeric piezoelectric material. There is no particular restriction on the electrode, and examples thereof to be used include ITO, ZnO, IZO (registered trade marks), and an electroconductive polymer.

Further, a polymeric piezoelectric material according to the present invention and an electrode may be piled up one another and used as a laminated piezoelectric element. For example, units of an electrode and a polymeric piezoelectric material are piled up recurrently and finally a principal plane of a polymeric piezoelectric material not covered by an electrode is covered by an electrode. Specifically, that with two recurrent units is a laminated piezoelectric element having an electrode, a polymeric piezoelectric material, an electrode, a polymeric piezoelectric material, and an electrode in the mentioned order. With respect to a polymeric piezoelectric material to be used for a laminated piezoelectric element, at least one layer of polymeric piezoelectric material is required to be made of a polymeric piezoelectric material according to the present invention, and other layers may not be made of a polymeric piezoelectric material according to the present invention.

In the case that plural polymeric piezoelectric materials according to the present invention are included in a laminated piezoelectric element, if an optically active polymer contained in a polymeric piezoelectric material according to the present invention in a layer has L-form optical activity, an optically active polymer contained in a polymeric piezoelectric material in another layer may be either of L-form and D-form. The location of polymeric piezoelectric materials may be adjusted appropriately according to an end use of a piezoelectric element.

For example, if the first layer of a polymeric piezoelectric material containing as a main component an L-form optically active polymer is laminated intercalating an electrode with the second polymeric piezoelectric material containing as a main component an L-form optically active polymer, the uniaxial stretching direction (principal stretching direction) of the first polymeric piezoelectric material should preferably cross, especially orthogonally cross, the uniaxial stretching direction (principal stretching direction) of the second polymeric piezoelectric material so that the displacement directions of the first polymeric piezoelectric material and the second polymeric piezoelectric material can be aligned, and that the piezoelectricity of a laminated piezoelectric element as a whole can be favorably enhanced.

On the other hand, if the first layer of a polymeric piezoelectric material containing as a main component an L-form optically active polymer is laminated intercalating an electrode with the second polymeric piezoelectric material containing as a main component an D-form optically active polymer, the uniaxial stretching direction (principal stretching direction) of the first polymeric piezoelectric material should preferably be arranged nearly parallel to the uniaxial stretching direction (principal stretching direction) of the second polymeric piezoelectric material so that the displacement directions of the first polymeric piezoelectric material and the second polymeric piezoelectric material can be aligned, and that the piezoelectricity of a laminated piezoelectric element as a whole can be favorably enhanced.

Especially, if a principal plane of a polymeric piezoelectric material is provided with an electrode, it is preferable to provide a transparent electrode. In this regard, a transparent electrode means specifically that its internal haze is 40% or less (total luminous transmittance is 60% or more).

The piezoelectric element using a polymeric piezoelectric material according to the present invention may be applied to the aforementioned various piezoelectric devices including a loudspeaker and a touch panel. A piezoelectric element provided with a transparent electrode is favorable for applications, such as a loudspeaker, a touch panel, and an actuator.

EXAMPLES

The embodiment of the present invention will be described below in more details by way of Examples, provided that the current embodiment is not limited to the following Examples to the extent not to depart from the spirit of the embodiment.

Example 1

A polylactic acid-type resin (Registered trade mark LACEA, H-400; weight-average molecular weight Mw: 200,000; made by Mitsui Chemicals, Inc.) was charged into an extruder hopper, heated to 220° C. to 230° C., extruded through a T-die, and contacted with a cast roll at 50° C. for 0.3 min to form a 230 μm-thick pre-crystallized sheet (pre-crystallization step). The crystallinity of the pre-crystallized sheet was measured to find 4%.

The obtained pre-crystallized sheet was stretched biaxially simultaneously with heating at 80° C. to 3.0-fold in the TD direction by a tenter method (principal stretching) and to 2.0-fold in the MD direction by a roll-to-roll method (secondary stretching) to obtain a film (stretching step).

The film after the stretching step was contacted with rolls heated to 145° C. by a roll-to-roll method to perform an annealing treatment, and quenched to produce a polymeric piezoelectric material (annealing treatment step). In this regard, the quenching was performed by contacting the film, after the annealing treatment, with air at 20° C. to 30° C., and further contacting the same with metallic rolls of a film winding machine to rapidly lower the film temperature to close to room temperature.

Examples 2 to 8, and Comparative Examples 1 to 2

Polymeric piezoelectric materials of Example 2 to Example 8 and Comparative Examples 1 to 2 were produced identically, except that the pre-crystallization conditions and the stretching conditions in the production of a polymeric piezoelectric material in Example 1 were changed to those described in Table 1.

In Examples 5 to 8, the principal stretching direction was set in the MD direction, and the secondary stretching direction in the TD direction.

TABLE 1

| | Physical properties of resin | | | | | Pre-crystallization conditions | | Pre-crystallized sheet Crystallinity (%) |
|---|---|---|---|---|---|---|---|---|
| | Resin | Chirality | Mw | Mw/Mn | Optical purity (% ee) | Heating time (min) | Heating temperature (° C.) | |
| Example 1 | LA | L | 200000 | 2.87 | 98.5 | 0.3 | 50 | 4 |
| Example 2 | LA | L | 200000 | 2.87 | 98.5 | 0.3 | 50 | 4 |
| Example 3 | LA | L | 200000 | 2.87 | 98.5 | 0.3 | 50 | 4 |
| Example 4 | LA | L | 200000 | 2.87 | 98.5 | 0.3 | 50 | 4 |
| Example 5 | LA | L | 200000 | 2.87 | 98.5 | 0.3 | 50 | 4 |
| Example 6 | LA | L | 200000 | 2.87 | 98.5 | 0.3 | 50 | 4 |
| Example 7 | LA | L | 200000 | 2.87 | 98.5 | 0.3 | 50 | 4 |
| Example 8 | LA | L | 200000 | 2.87 | 98.5 | 0.3 | 50 | 4 |
| Comparative Example 1 | LA | L | 200000 | 2.87 | 98.5 | 0.3 | 50 | 4 |
| Comparative Example 2 | LA | L | 200000 | 2.87 | 98.5 | 0.24 | 40 | 3 |

| | | Stretching conditions | | | | Annealing conditions | |
|---|---|---|---|---|---|---|---|
| | Process | Ratio (TD) | Ratio (MD) | Temperature (° C.) | Width (mm) | Temperature (° C.) | Chilling conditions |
| Example 1 | Simultaneous biaxial stretching | 3.0 | 2.0 | 80 | 300 | 145 | Quenched |
| Example 2 | Simultaneous biaxial stretching | 3.5 | 2.0 | 80 | 350 | 145 | Quenched |
| Example 3 | Simultaneous biaxial stretching | 4.0 | 2.0 | 80 | 400 | 145 | Quenched |
| Example 4 | Simultaneous biaxial stretching | 4.0 | 2.0 | 90 | 400 | 145 | Quenched |
| Example 5 | Simultaneous biaxial stretching | 1.2 | 3.0 | 80 | 120 | 110 | Quenched |

TABLE 1-continued

| | | | | | | | |
|---|---|---|---|---|---|---|---|
| Example 6 | Simultaneous biaxial stretching | 1.39 | 3.0 | 80 | 139 | 110 | Quenched |
| Example 7 | Simultaneous biaxial stretching | 1.39 | 4.0 | 80 | 139 | 110 | Quenched |
| Example 8 | Simultaneous biaxial stretching | 1.39 | 3.5 | 80 | 139 | 110 | Quenched |
| Comparative Example 1 | Uniaxial stretching | 1.0 | 3.3 | 70 | 100 | 130 | Quenched |
| Comparative Example 2 | Uniaxial stretching | 1.0 | 5.6 | 73 | 100 | 100 | Quenched |

-Measurement of Amounts of L-Form and D-Form of Resin (Optically Active Polymer)-

Into a 50 mL Erlenmeyer flask 1.0 g of a weighed-out sample (polymeric piezoelectric material) was charged, to which 2.5 mL of IPA (isopropyl alcohol) and 5 mL of a 5.0 mol/L sodium hydroxide solution were added. The Erlenmeyer flask containing the sample solution was then placed in a water bath at the temperature of 40° C., and stirred until polylactic acid was completely hydrolyzed for about 5 hours.

After the sample solution was cooled down to room temperature, 20 mL of a 1.0 mol/L hydrochloric acid solution was added for neutralization, and the Erlenmeyer flask was stoppered tightly and stirred well. The sample solution (1.0 mL) was dispensed into a 25 mL measuring flask and diluted to 25 mL with a mobile phase to prepare a HPLC sample solution 1. Into an HPLC apparatus 5 μL of the HPLC sample solution 1 was injected, and D/L-form peak areas of polylactic acid were determined under the following HPLC conditions. The amounts of L-form and D-form were calculated therefrom.

-HPLC Measurement Conditions-
Column: Optical resolution column, SUMICHIRAL OA5000 (by Sumika Chemical Analysis Service, Ltd.)
Measuring apparatus: Liquid chromatography (by Jasco Corporation)
Column temperature: 25° C.
Mobile phase: 1.0 mm-copper (II) sulfate buffer solution/IPA=98/2 (V/V)
Copper (II) sulfate/IPA/water=156.4 mg/20 mL/980 mL
Mobile phase flow rate: 1.0 mL/min
Detector: Ultraviolet detector (UV 254 nm)

<Molecular Weight Distribution>

The molecular weight distribution (Mw/Mn) of a resin (optically active polymer) contained in each polymeric piezoelectric material of Examples and Comparative Examples was measured using a gel permeation chromatograph (GPC) by the following GPC measuring method.

-GPC Measuring Method-
Measuring apparatus: GPC-100 (by Waters)
Column: SHODEX LF-804 (by Showa Denko K.K.)
Preparation of sample: Each polymeric piezoelectric material of Examples and Comparative Examples was dissolved in a solvent (chloroform) at 40° C. to prepare a sample solution with the concentration of 1 mg/mL.
Measuring conditions: 0.1 mL of a sample solution was introduced into the column at a temperature of 40° C. and a flow rate of 1 mL/min by using chloroform as a solvent, and the concentration of the sample that was contained in the sample solution and separated by the column was measured by a differential refractometer. With respect to the molecular weight of a resin, a universal calibration curve was prepared using polystyrene standard samples, and the weight-average molecular weight (Mw) for each resin was calculated therefrom. The measurement results for resins used in Examples and Comparative Example are shown in Table 1. In Table 1 "LA stands for LACEA H-400.

<Measurement of Physical Properties and Evaluation>

With respect to each polymeric piezoelectric material of Example 1 to Example 8, and Comparative Examples 1 to 2 obtained as above, the glass transition temperature Tg, melting point Tm, crystallinity, specific heat capacity Cp, thickness, internal haze, piezoelectric constant, MORc, and the rate of dimensional change were measured, and the longitudinal tearing property was evaluated.

The evaluation results are shown in Table 2.

The measurements were carried out specifically as follows.

[Glass Transition Temperature Tg, Melting Point Tm, and Crystallinity]

Each 10 mg of respective polymeric piezoelectric materials of Examples and Comparative Examples was weighed accurately and measured by a differential scanning calorimeter (DSC-1, by Perkin Elmer Inc.) at a temperature increase rate of 10° C./min to obtain a melting endothermic curve. From the obtained melting endothermic curve the melting point Tm, glass transition temperature Tg, specific heat capacity Cp and crystallinity were obtained.

[Specific Heat Capacity Cp]

The amount of heat required to elevate the temperature by 1° C. per 1 g was measured when the respective polymeric piezoelectric materials of Examples and Comparative Examples were measured by the differential scanning calorimeter. The measurement conditions were similar to the conditions for Tg and Tm.

[Rate of Dimensional Change]

Each polymeric piezoelectric material of Examples and Comparative Examples was cut to a length of 50 mm in the MD direction and to 50 mm in the TD direction, to cut out a piece of 50 mm×50 mm rectangular film. The film was hanged in an oven set at 85° C. and subjected to an annealing treatment for 30 min (the annealing treatment for evaluation of the rate of dimensional change is hereinafter referred to as "annealing B"). During that procedure the length of the film rectangle side in the MD direction before and after the annealing B was measured by calipers, and the rate of dimensional change (%) was calculated according to the following expression. From the absolute value of the rate of dimensional change the dimensional stability was evaluated.

If the rate of dimensional change is lower, it means the dimensional stability is the higher.

Rate of dimensional change (%)=100×[(side length in the MD direction before annealing B)−(side length in the MD direction after annealing B)]/(side length in the MD direction before annealing B)

[Internal Haze]

"Internal haze" means herein the internal haze of a polymeric piezoelectric material according to the present invention, and measured by a common measuring method.

Specifically, the internal haze (hereinafter also referred to as "internal haze (H1)") of each polymeric piezoelectric material of Examples and Comparative Examples was measured by measuring the light transmittance in the thickness direction. More precisely, the haze (H2) was measured by placing in advance only a silicone oil (Shin-Etsu Silicone™, grade: KF96-100CS; by Shin-Etsu Chemical Co., Ltd.) between 2 glass plates; then the haze (H3) was measured by placing a film (polymeric piezoelectric material), whose surfaces were wetted uniformly with the silicone oil, between 2 glass plates; and finally the internal haze (H1) of each polymeric piezoelectric material of Examples and Comparative Examples was obtained by calculating the difference between the above two according to the following formula:

Internal haze (*H*1)=haze (*H*3)−haze (*H*2)

The haze (H2) and haze (H3) in the above formula were determined by measuring the light transmittance in the thickness direction using the following apparatus under the following measuring conditions.

Measuring apparatus: HAZE METER TC-HIIIDPK (by Tokyo Denshoku Co., Ltd.)
Sample size: Width 30 mm×length 30 mm, (see Table 2 for the thickness)
Measuring conditions: According to JIS-K7105
Measuring temperature: Room temperature (25° C.)

[Piezoelectric Constant $d_{14}$ (by Displacement Method)]

A specimen (polymeric piezoelectric material) of 40 mm×40 mm with the Ag conductive layers on both planes formed was cut to a length of 32 mm in the direction of 45° with respect to the stretching direction (MD direction) of a polymeric piezoelectric material, and to 5 mm in the direction perpendicular to the above 45° direction, to cut out a piece of rectangular film in a size of 32 mm×5 mm. This was used as a sample for measuring the piezoelectric constant. A sine-wave alternating voltage of 10 Hz and 300 Vpp was applied to to the prepared sample, and a difference distance between the maximum value and the minimum value of the displacement of the film was measured by a laser spectral-interference displacement meter SI-1000 (by Keyence Corporation). A value obtained by dividing the measured displacement (mp-p) by the reference length of the film, which was 30 mm, was defined as strain, and a value obtained by dividing the strain by an electric field intensity applied to the film ((applied voltage (V))/(film thickness)) and multiplying by 2, was defined as piezoelectric constant $d_{14}$ (pm/V).

[Standardized Molecular Orientation MORc]

Standardized molecular orientation MORc was measured for each of polymeric piezoelectric materials of Examples and Comparative Examples by a microwave molecular orientation meter MOA-6000 by Oji Scientific Instruments. The reference thickness tc was set at 50 μm.

[Evaluation of Longitudinal Tearing Property]

The longitudinal tearing property was evaluated with respect to each of polymeric piezoelectric materials of Examples and Comparative Examples by measuring the tear strength in the MD direction and the tear strength in the TD direction respectively according to the "Right angled tear method" stipulated in JIS K 7128-3 "Plastics—Tear strength of films and sheets".

With respect to the evaluation of the longitudinal tearing property, when both the tear strength in the MD direction and the tear strength in the TD direction are high, it means that deterioration of the longitudinal tear strength is suppressed. In other words, if at least one of the tear strength in the MD direction and the tear strength in the TD direction is low, it means that the longitudinal tear strength is deteriorated.

In the measurement of the tear strength, the crosshead speed of a tensile testing machine was set at 200 mm/min and the tear strength was calculated according to the following formula:

*T=F/d* wherein T stands for the tear strength (N/mm), F for the maximum tear load, and d for the thickness (mm) of a specimen.

TABLE 2

|  | Tg (° C.) | Cp (J/g ° C.) | Tm (° C.) | Crystallinity (%) | Thickness (μm) | MORc @50 μm | Internal haze (%) | Piezoelectric constant (pm/V) |
|---|---|---|---|---|---|---|---|---|
| Example 1 | 74.2 | 0.09 | 171.0 | 38.4 | 32.4 | 2.95 | 0.1 | 3.5 |
| Example 2 | 74.1 | 0.29 | 172.0 | 37.1 | 37.6 | 4.39 | 0.3 | 5.8 |
| Example 3 | 74.4 | 0.26 | 172.0 | 37.8 | 31.6 | 4.05 | 0 | 5.6 |
| Example 4 | 74.8 | 0.22 | 172.2 | 39.2 | 36.5 | 4.04 | 0.2 | 6.4 |
| Example 5 | N.D. | N.D. | 169.3 | 36.3 | 46.9 | 4.89 | 0.38 | 5.1 |
| Example 6 | N.D. | N.D. | 168.6 | 39.1 | 45.8 | 4.27 | 0.48 | 4.9 |
| Example 7 | N.D. | N.D. | 169.8 | 39.3 | 43.2 | 4.71 | 0.2 | 5.7 |
| Example 8 | N.D. | N.D. | 168.9 | 40.8 | 43.2 | 4.42 | 0.04 | 4.9 |
| Comparative Example 1 | 70.4 | 0.31 | 169.3 | 43.9 | 60.0 | 6.10 | 0.3 | 7.0 |
| Comparative Example 2 | 77.9 | 0.24 | 167.6 | 47.9 | 43.0 | 5.32 | 17.1 | 5.1 |

TABLE 2-continued

| | MORc × Crystallinity | Length after annealing (mm) | Rate of dimensional change (%) | Evaluation result of longitudinal tear property | |
|---|---|---|---|---|---|
| | | | | MD Direction (N/mm) | TD Direction (N/mm) |
| Example 1 | 113 | 50 | 0.00 | 88.2 | 136.5 |
| Example 2 | 163 | 49.7 | 0.60 | 91.2 | 150.6 |
| Example 3 | 153 | 49.4 | 1.20 | 88.8 | 125.8 |
| Example 4 | 158 | 49.3 | 1.40 | 84.9 | 144.4 |
| Example 5 | 177 | N.D. | N.D. | 109.5 | 191.2 |
| Example 6 | 167 | N.D. | N.D. | 91.9 | 187.1 |
| Example 7 | 185 | N.D. | N.D. | 94.0 | 210.5 |
| Example 8 | 180 | N.D. | N.D. | 141.7 | 194.0 |
| Comparative Example 1 | 268 | 50 | 0.00 | 52.2 | 410.9 |
| Comparative Example 2 | 255 | N.D. | N.D. | 48.2 | N.D. |

As seen in Table 2, in Examples 1 to 8, a deterioration of the longitudinal tear strength (here tear strength in the MD direction) was suppressed compared to Comparative Example 1.

Also in Examples 1 to 8, the transparency was good (namely, the internal haze was low) and the piezoelectric constants were high (1 pm/V or higher).

On the other hand, in Comparative Example 2, although the piezoelectric constant was almost same as in Examples 1 to 8, the longitudinal tear strength (here tear strength in the MD direction) deteriorated compared to Examples 1 to 8.

Meanwhile, "N.D." in Table 2 means that a measurement was omitted and there is no data.

The entire disclosure of Japanese Patent Applications No. 2011-272708 is incorporated herein by reference.

All publications, patent applications, and technical standards described in this specification are herein incorporated by reference to the same extent as if each individual publication, patent application, or technical standard was specifically and individually indicated to be incorporated by reference.

The invention claimed is:

1. A process for producing a polymeric piezoelectric material comprising a first step of heating a sheet in an amorphous state containing a helical chiral polymer to obtain a pre-crystallized sheet, and a second step of stretching the pre-crystallized sheet in biaxial directions, wherein
the polymeric piezoelectric material comprises a helical chiral polymer having a weight-average molecular weight of from 50,000 to 1,000,000 and having optical activity,
wherein a crystallinity of the material measured by a DSC method is from 20% to 80%, and a product of a standardized molecular orientation MORc measured by a microwave transmission type molecular orientation meter based on a reference thickness of 50 μm and the crystallinity is from 25 to 250.

2. The process for producing a polymeric piezoelectric material according to claim 1, wherein, in the first step for obtaining the pre-crystallized sheet, the sheet in an amorphous state is heated at a temperature T satisfying the following formula until the crystallinity becomes between 1% and 70%:

$$Tg-40°\ C.\leq T\leq Tg+40°\ C.$$

wherein Tg represents a glass transition temperature of the helical chiral polymer.

3. The process for producing a polymeric piezoelectric material according to claim 1, wherein the sheet in an amorphous state contains polylactic acid as the helical chiral polymer, and wherein the sheet is heated at from 20 ° C. to 170 ° C. for from 5 sec to 60 min in the first step.

4. The process for producing a polymeric piezoelectric material according to claim 1, wherein an annealing treatment is conducted after the second step.

5. The process for producing a polymeric piezoelectric material according to claim 1, wherein the crystallinity of the polymeric piezoelectric material is from 20% to 40.8%.

6. The process for producing a polymeric piezoelectric material according to claim 1, wherein an internal haze of the polymeric piezoelectric material with respect to visible light is 40% or less.

7. The process for producing a polymeric piezoelectric material according to claim 1, wherein the standardized molecular orientation MORc of the polymeric piezoelectric material is from 4.0 to 10.0.

8. The process for producing a polymeric piezoelectric material according to claim 1, wherein a piezoelectric constant $d_{14}$ measured by a displacement method at 25° C. of the polymeric piezoelectric material is 1 pm/V or higher.

9. The process for producing a polymeric piezoelectric material according to claim 1, wherein the helical chiral polymer is a polylactic acid-type polymer having a main chain comprising a repeating unit represented by the following formula (1):

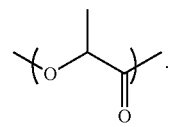

(1)

10. The process for producing a polymeric piezoelectric material according to claim 1, wherein an optical purity of the helical chiral polymer is 95.00% ee or higher.

11. The process for producing a polymeric piezoelectric material according to claim 1, wherein a piezoelectric constant $d_{14}$ measured by a displacement method at 25° C. of the polymeric piezoelectric material is from 3 pm/V to 6.4 pm/V.

12. The process for producing a polymeric piezoelectric material according to claim 1, wherein the crystallinity of the polymeric piezoelectric material is from 36.3% to 40.8%, and the product of the standardized molecular orientation MORc and the crystallinity is from 113 to 185.

13. The process for producing a polymeric piezoelectric material according to claim 1, wherein the crystallinity of the polymeric piezoelectric material is from 20% to 39.3%.

* * * * *